United States Patent
Park et al.

(10) Patent No.: US 7,573,758 B2
(45) Date of Patent: Aug. 11, 2009

(54) PHASE-CHANGE RANDOM ACCESS MEMORY (PRAM) PERFORMING PROGRAM LOOP OPERATION AND METHOD OF PROGRAMMING THE SAME

(75) Inventors: Joon-Min Park, Dongjak-gu (KR); Du-Eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 11/853,955

(22) Filed: Sep. 12, 2007

(65) Prior Publication Data

US 2008/0068903 A1 Mar. 20, 2008

(30) Foreign Application Priority Data

Sep. 15, 2006 (KR) ...................... 10-2006-0089681

(51) Int. Cl.
*G11C 7/22* (2006.01)
(52) U.S. Cl. ........................... 365/189.16; 365/189.12; 365/201; 365/225.7; 365/148; 365/163
(58) Field of Classification Search ................ 365/163, 365/148, 189.16, 201, 189.15, 189.12, 225.7
See application file for complete search history.

(56) References Cited

U.S. PATENT DOCUMENTS

| 6,141,241 | A | * | 10/2000 | Ovshinsky et al. | .......... 365/163 |
| 6,879,525 | B2 | | 4/2005 | Brocklin et al. | |
| 6,965,521 | B2 | * | 11/2005 | Li et al. | ..................... 365/113 |
| 7,116,593 | B2 | * | 10/2006 | Hanzawa et al. | ............ 365/203 |

FOREIGN PATENT DOCUMENTS

| JP | 10214492 A | 8/1998 |
| JP | 2002133879 A | 5/2002 |
| KR | 199862405 | 11/1998 |
| KR | 1020030002419 A | 1/2003 |
| KR | 1020040041069 A | 5/2004 |

* cited by examiner

*Primary Examiner*—Andrew Q Tran
(74) *Attorney, Agent, or Firm*—Volentine & Whitt, PLLC

(57) ABSTRACT

A PRAM and programming method are disclosed. The PRAM includes a memory cell array including a test cell, a write driver applying a program pulse and providing a program current to the memory cell array, a sense amplification and verification circuit reading data programmed in the memory cell array and performing a program verify operation on the data, and a program loop control unit storing program verification result for the test cell at each program loop during test operation and generating the program pulse according to the program verification result to control the start of the program loop during normal operation.

20 Claims, 8 Drawing Sheets

US 7,573,758 B2

PHASE-CHANGE RANDOM ACCESS MEMORY (PRAM) PERFORMING PROGRAM LOOP OPERATION AND METHOD OF PROGRAMMING THE SAME

CROSS-REFERENCE TO RELATED APPLICATIONS

This U.S. non-provisional patent application claims priority under 35 U.S.C. § 119 to Korean Patent Application No. 10-2006-0089681, filed on Sep. 15, 2006, the subject matter of which is hereby incorporated by reference.

BACKGROUND OF THE INVENTION

1. Field of the Invention

The present invention relates to a semiconductor memory device. More particularly, the invention relates to a PRAM performing program loop operations and a method of programming same.

2. Description of the Related Art

Semiconductor memory devices may be classified random access memory (RAM) devices and read only memory (ROM) devices. ROM is typically implemented as a nonvolatile memory that retains stored data when power is not applied. Examples of ROM are Programmable ROM (PROM), Erasable PROM (EPROM), Electrically EPROM (EEPROM), Flash Memory, etc. Flash memory may be further classified as NOR flash memory and a NAND flash memory.

RAM has conventionally been implemented in volatile memory that looses stored data when power is no longer applied. Examples of RAM include Dynamic RAM (DRAM) and Static RAM (SRAM).

Many emerging memory devices seek to replace the capacitor element conventionally associated with a DRAM with a nonvolatile material. Examples of such devices include the Ferroelectric RAM (FRAM) which uses a ferroelectric capacitor, the magnetic RAM (MRAM) which uses a tunneling magneto-resistive (TMP) layer, and the Phase change RAM which uses a material such as chalcogenide alloys to implement a data storage element having changeable material states.

Thus, PRAM is a nonvolatile memory device that uses a changeable phase state (e.g., a resistance property) which is response to an applied temperature condition. Thus far, the PRAM has manifest an ability to be manufactured using a relatively simple (low cost) process and may be used to implement high-capacity memory devices.

Figure (FIG.) 1 is a schematic diagram of a memory cell in a PRAM. Referring to FIG. 1, a memory cell 10 includes a memory element 11, and a select element 12. Memory element 11 is connected between a bit line BL and select element 12. Select element 12 is gated by a word line and is connected between memory element 11 and ground.

Memory element 11 may be implemented with a phase change material, such as GST. The phase change material may be placed in a crystalline state or an amorphous state by applying different temperature conditions. In current practice, the state of the phase change material is defined by the application of a heating current through the bit line BL. Thus, the PRAM programs data in relation to the material state properties of certain phase change materials such as GST.

Select element 12 may be implemented by an NMOS transistor (NT). The word line WL is connected to the gate of the NMOS transistor NT. When a predetermined voltage is applied to the word line WL, the NMOS transistor NT is turned ON. When the NMOS transistor NT is turned ON, memory element 11 receives a current through the bit line BL. Referring to FIG. 1, memory element 11 is connected between the bit line BL and the select element 12. However, select element 12 may be alternately be connected between the bit line BL and the memory element 11.

FIG. 2 is another schematic diagram of an alternate PRAM implementation. Referring to FIG. 2, a memory cell 20 includes a memory element 21 and a select element 22. Memory element 21 is connected between the bit line BL and select element 22, and select element 22 is connected between memory element 21 and ground. Memory element 21 may be identical to memory element 11 of FIG. 1.

However, select element 22 may be alternately implemented using a diode D. Memory element 21 is connected to the anode of the diode D, and the word line WL is connected to its cathode. When a voltage difference between the anode and the cathode of the diode D is higher then its threshold voltage, the diode D is turned ON. When the diode is turned ON, memory element 21 is supplied with current through the bit line BL.

FIG. 3 is a graph illustrating the material phase state characteristics of an exemplary phase change material (e.g., GST) as a function of respective temperature conditions. Referring to FIG. 3, one phase state for the phase change material is termed the amorphous state (1). Another phase state for the phase change material is termed the crystalline state (2).

Referring to FIG. 3, the phase change material assumes the amorphous state by being quickly quenched after being heated above its melting temperature Tm over a relatively short period of time T1. The amorphous state is commonly associated with a "reset" state or a stored data value of 1.

In contrast, the phase change material assumes the crystalline state by being cooled at a relatively slow rate over a time period T2 (longer then T1) after being heated above its crystallization temperature Tc (lower than the melting temperature Tm). The crystalline state is commonly associated with a "set" state or a stored data value of 0. In the PRAM, the resistance of the memory cell will vary with its material state (i.e., a relatively high resistance in the amorphous state and a relatively low resistance in the crystalline state).

Conventional PRAMs include a write driver circuit supplying a program current to the phase change material of constituent memory cell(s) during a program operation. The write driver circuit supplies the program current, (i.e., either a set current or a reset current) to one or more selected cells in relation to an externally provided supply voltage (e.g., 2.5 V). When applied through the phase change material of the selected memory cell(s), the set current will induce a temperature condition that places the phase change material into its set state. In similar vein, the reset current will place the phase change material into the set state.

In order to improve programming reliability, the PRAM performs a program verify operation as part of the program operation. In general, the PRAM runs iterative programming loop that increases the program current on a step by step basis while performing the program and program verify operations.

During each program loop, the program verify operation is performed following a program operation. According to a program verification result obtained by the program verify operation, the program current is increased when memory cell programming fails. Following this increase in program current, another program loop operation is run. This iterative loop continues until the selected memory cell(s) are properly programmed (a "pass" condition).

This iterative programming loop approach improves the reliability of program data. On the other hand, the iterative program loop approach lengthens the overall programming time. Moreover, the life-time durability of the constituent memory cells is reduced by the repeated application of a programming current over numerous programming loop operations. Finally, a relatively large amount of power may be consumed using the programming loop approach.

SUMMARY OF THE INVENTION

Embodiments of the invention provide a PRAM performing a program loop operation having a reduced overall programming time and reduced current consumption. Embodiments of the invention also provide a method for programming such a PRAM. In at least one aspect, a PRAM designed and implemented according to an embodiment of the invention may omit unnecessary program loops in order to provide faster programming speeds with reduced current consumption.

In one embodiment, the invention provides a phase change random access memory (PRAM) performing a program loop operation, the PRAM comprising; a memory cell array including a test cell, a write driver applying a program pulse and providing a program current to the memory cell array, a sense amplification and verification circuit reading data programmed in the memory cell array and performing a program verify operation on the data, and a program loop control unit storing program verification result for the test cell at each program loop during test operation and generating the program pulse according to the program verification result to control the start of the program loop during normal operation.

In another embodiment, the invention provides a method of programming a phase change random access memory (PRAM), wherein memory cells within the PRAM are programmed by a program loop operation including a plurality of program loops, and the PRAM includes a memory cell array, a write driver providing a program current to the memory cell array according to a program loop, and a sense amplification and verification circuit reading data programmed in the memory cell array and performing a program verify operation in each program loop, the method comprising; performing a test operation to store program verification results for each program loop, and performing a normal operation that controls the start of the program loop according to the program verification result.

DESCRIPTION OF EMBODIMENTS

Embodiments of the invention will be now described with reference to the accompanying drawings. The present invention may, however, be embodied in different forms and should not be constructed as being limited to only the illustrated embodiments. Rather, the embodiments are presented as teaching examples.

Figure 1:
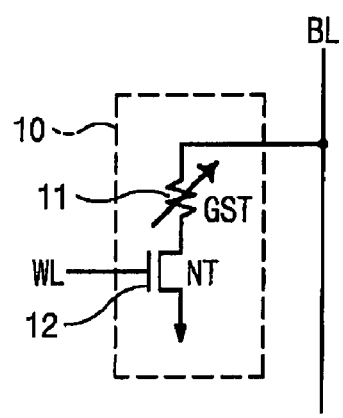
FIG. 1 is a schematic diagram of a memory cell in a PRAM.
Figure 2:
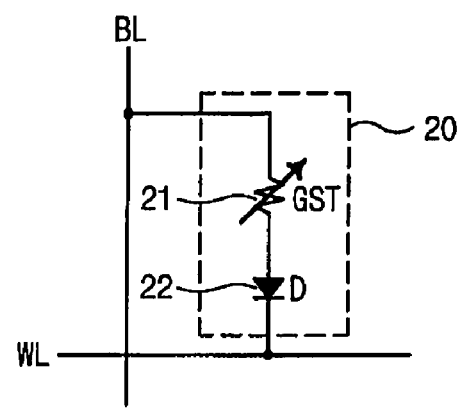
FIG. 2 is a schematic diagram of another memory cell in a PRAM.
Figure 3:
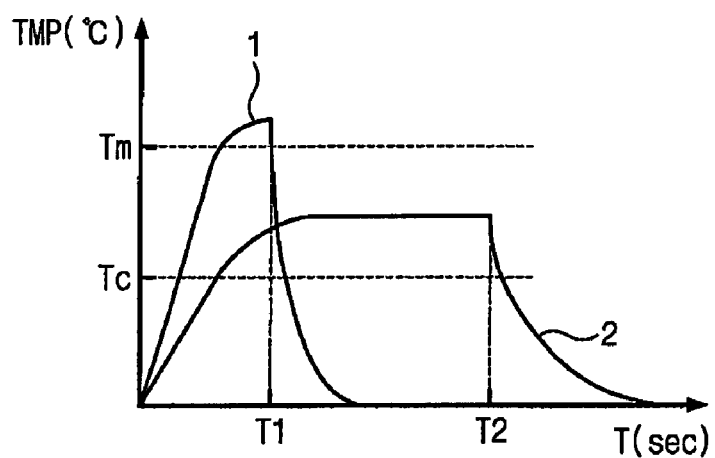
FIG. 3 is a graph illustrating phase state characteristics for a phase change material as a function of temperature condition.
Figure 4:
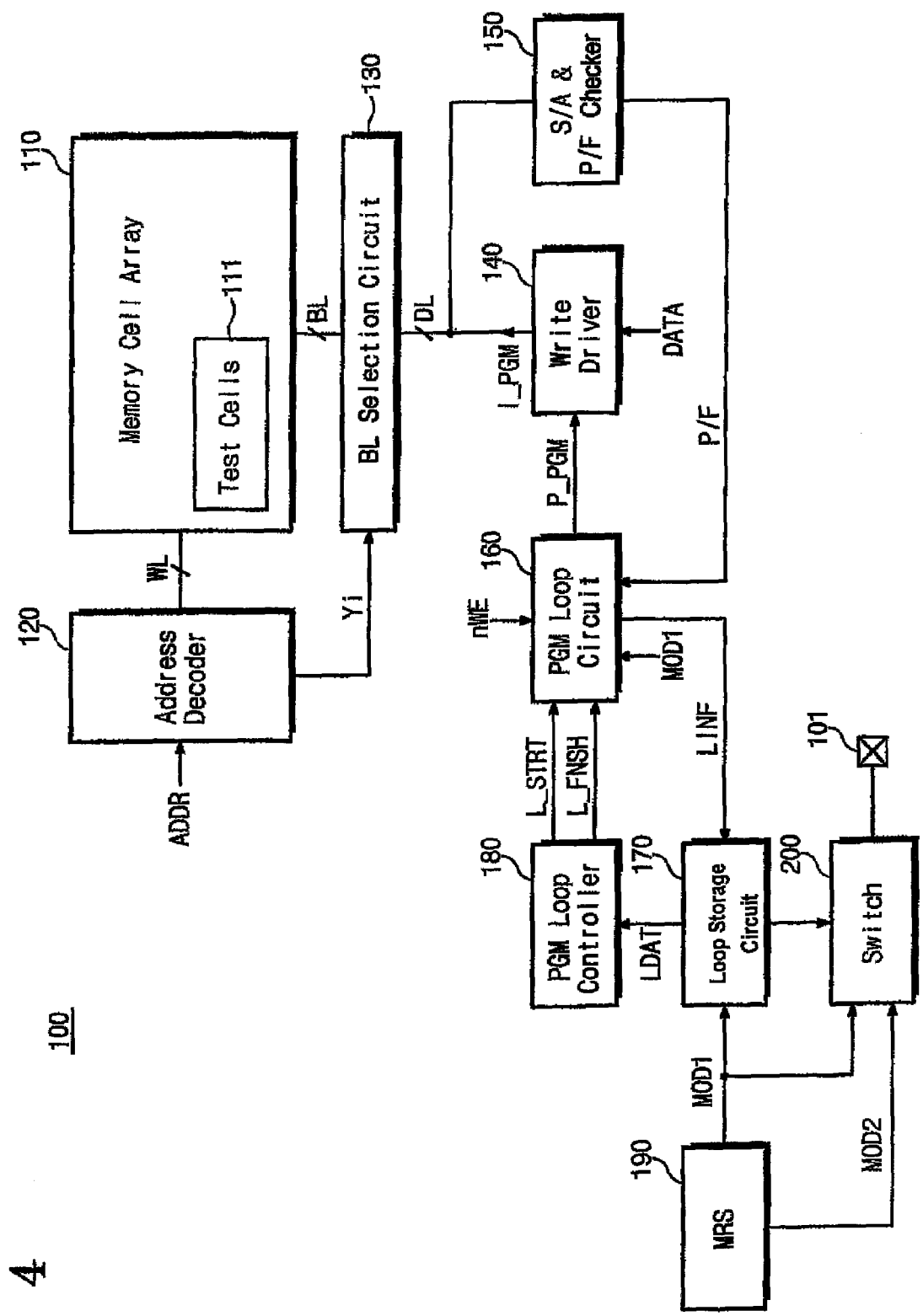
FIG. 4 is a block diagram of a PRAM according to an embodiment of the invention.

FIG. 4 is a block diagram illustrating a PRAM according to an embodiment of the invention. Referring to FIG. 4, a PRAM 100 includes a memory cell array 110, an address decoder 120, a BL selection circuit 130, a write driver 140, a sense amplification and verification circuit 150, and a program loop control unit. In the illustrated example, the program loop control unit includes a program loop circuit 160, a loop storage circuit 170, and a program loop controller 180.

Memory cell array 110 includes a plurality of memory cells (not shown). Each memory cell includes a memory element and a select element. The memory element includes a phase change material and the corresponding select element is assumed to include either an NMOS transistor or a diode.

Memory cell array 110 also includes certain memory cells defined as test cells 111. Test cells 111 are used during a test operation. Test cells 111 may be selected from amongst the memory cells forming memory cell array 110 so as to accurately represent all of the constituent memory cells. In the illustrated embodiment, PRAM 100 uses test cells 111 to identify unnecessary program loops.

Address decoder 120 is connected to memory cell array 110 through at least word line WL. Address decoder 120 decodes an externally provided address ADDR, and provides a bias voltage through a selected word line. Additionally, address decoder 120 generates a select signal Yi to select the bit line BL. The select signal Yi is provided in BL selection circuit 130. Address decoder 120 receives the address ADDR to select test cells 110 during a test operation.

BL selection circuit 130 is connected to memory cell array 110 through at least the bit line BL. Bit line selection circuit 130 selects a bit line in response to the select signal Yi provided from address decoder 120. Here, the NMOS transistor connects the bit line BL with the data line DL in response to the select signal Yi.

Write driver 140 receives the program pulse P_PGM and data DATA, and then provides a program current I_PGM through a data line DL. Here, the program pulse P_PGM is provided from program loop circuit 160, and includes a set pulse P_SET and a reset pulse P_RST. The program current I_PGM includes a set current I_SET and a reset current I_RST. Write driver 140 responds to the set pulse P_SET when data 0 is input to provide the set current I_SET, and responds to the reset pulse P_RST when data 1 is input to provide the reset current I_RST.

Sense amplification and verification circuit 150 reads the data stored in the memory cell during a read operation, and also performs the program verify operation. When data is normally programmed in the memory cell, a pass signal P is generated, otherwise a fail signal F is generated.

Sense amplification and verification circuit 150 includes a P/F checker. The P/F checker generates a pass signal P or a fail signal F according to the program verification results. The pass/fail signals P and F are provided to program loop circuit 160.

It is assumed for purposes of this illustration that PRAM 100 does not program 16 bits of data simultaneously. Rather, in order to reduce the peak program current applied during a program operation, defined groups of data are sequentially programmed. For example, 16 bit data may be sequentially programmed in 2 bit groups during 8 programming intervals, or 4 bit groups during 4 programming intervals. These program methods are referred to as x2 and x4 input/output methods, respectively. In these methods, 2 bit data or 4 bit data are simultaneously programmed in response to one program pulse. In the x2 input/output method, a peak program current applied during each program pulse may be reduced to one quarter. In the x4 input/output method, the peak program current applied during each program pulse is reduced to a half. Hereinafter, a programming operation assuming the x2 input/output method will be described with reference to FIGS. 8 and 9.

Thus, PRAM 100 is assumed to perform a programming loop operation in which each program loop includes a program operation and program verify operation performed using the x2 input/output method. According to the results of the program verify operation, the program current I_PGM increases in a case where the current program loop resulted in a program fail F. After increasing the program current, the next program loop is performed. However, when the program verify operation indicates that the current program loop has properly programmed the selected memory cell(s) (i.e. a program pass P), the program operation is terminated.

It should be noted in passing that conventional flash memory devices operate analogously with a PRAM in the context of a programming loop operation. Each memory cell in a flash memory device includes a floating gate. The floating gate accumulates electrons during each iteration of the programming loop. Accordingly, a flash memory device increases stored charge on an incremental basis during an iterative programming operation.

However, the PRAM does not iteratively accumulate charge (or phase state) over a sequence of programming loops directed to the memory cell. That is, the results of a previous program loop do not influence a current program loop for the PRAM. Each PRAM programming loop either independently defines the desired phase state for the selected memory cell(s), or not—albeit with an increasing current value.

The manner in which PRAM 100 omits unnecessary program loop(s) to reduce a programming time and power consumption is related in part to the operation of the program loop control unit, i.e., a program loop circuit 160, a loop storage circuit 170, and a program loop controller 180 in the illustrated example.

Program loop circuit 160 operates in response to a write enable signal nWE, and provides a program pulse P_PGM to write driver 140. Program loop circuit 160 performs a program loop operation in response to a first mode signal MOD1 during a test operation. Here, the first mode signal MOD is provided from a mode register set MRS 190.

Program loop circuit 160 receives either a pass signal P or a fail signal F from sense amplification and verification circuit 150 following each programming loop. When the fail signal F is received, program loop circuit 160 increases a loop count and performs a next program loop. However, when the pass signal P is received, the loop information LINF for the current programming loop is provided to loop storage circuit 170.

Additionally, program loop circuit 160 receives a loop start signal L_STRT or a loop finish signal L_FNSH from program loop controller 180. Here, the loop start signal L_STRT is a signal notifying the start of the programming loop, and the loop finish signal L_FNSH is a signal notifying the end of the programming loop. The loop start signal L_STRT and the loop finish signal L_FNSH will be described in some additional detail with reference to FIGS. 8 and 9.

Loop storage circuit 170 stores the program verification results for respective programming loops in response of the loop information LINF. Loop storage circuit 170 may includes a loop storage register 171 such as those shown in f FIGS. 5 and 6 for storing the program verification result. Loop storage register 171 includes a plurality of registers R1 through Rn. The registers R1 through Rn store the program verification result for each programming loop.

For example, the program verification result of the first program loop Loop1 is stored in the first register R1, and the program verification result of the second program Loop2 is stored in the second register R2. Each register stores data 0 by default, and data 1 is stored in a corresponding register in response to a program pass P.

PRAM 100 may adjust the start or the finish of an applied program loop according to the loop data LDAT stored in the loop storage circuit 170. In the above example, when the first register R1 stores 0 and the second register R2 stores 1, PRAM 100 may omit the first program loop Loop1, and start the programming operation at the second program loop Loop2. This will be described in some additional detail with reference to FIG. 9.

Loop storage circuit 170 operates in response to the first mode signal MOD1. Here, the first mode signal MOD1 is a test mode signal for storing loop information LINF in loop storage circuit 170 during a test operation. The first mode signal MOD1 is provided from mode register set MRS 190. Loop storage circuit 170 stores the loop information LINF in loop storage register 171 during a test mode. Loop storage circuit 170 stores the loop data LDAT in program loop controller 180 during a normal mode. The test mode is described with reference to FIG. 8, and the normal mode is described with reference to FIG. 9.

Loop storage circuit 170 stores the program verification result for each program loop in response to the first mode signal MOD1 during a test mode. The test operation may include a wafer test operation or a chip test operation. That is, loop storage circuit 170 stores the program verification result for each program loop run as part of a chip testing procedure following its manufacture. Thus, the different program verification results will vary for individual chips.

Loop storage circuit 170 provides the loop data LDATA to program loop controller 180 during normal mode. The loop information LINF is the program verification result provided to the loop storage Register LINF, and the loop data LDAT are stored in the loop setting unit (referring to FIGS. 5 and 6). Exemplary structures and operation for loop storage circuit 170 will be described with reference to FIGS. 5 and 6.

Program loop controller 180 performs a program loop operation according to the loop data LDAT stored in loop storage circuit 170 during normal mode. Program loop controller 180 provides the loop start signal L_STRT or the loop finish signal L_FNSH to the program loop circuit 160 according to the loop data LDAT.

In the illustrated example, PRAM 100 also includes a switch 200 outputting the loop information LINF or the loop data LDAT stored in loop storage circuit 170. Switch 200 is turned ON/OFF in response to the first and second mode signals MOD1 and MOD2. Here, the first and second mode signals MOD1 and MOD2 are provided from mode register set MRS 200. The second mode signal MOD2 is generated when reading the loop information LIFN stored in loop storage circuit 170 through a corresponding signal pad 101. For example, the loop information LINF stored in loop storage register 171 of FIG. 6 may be read through pad 101, and a fuse in loop setting unit 173 of FIG. 6 may be cut in relation to the read loop information.

PRAM 100 of FIG. 4 performs a programming loop operation using test cells 111 during test operation, and stores program verification result for each program loop in loop storage circuit 170. During normal operation, a programming loop operation is performed based on the program verification result stored in loop storage circuit 170, such that unnecessary program loop(s) may be omitted.

Figure 5:
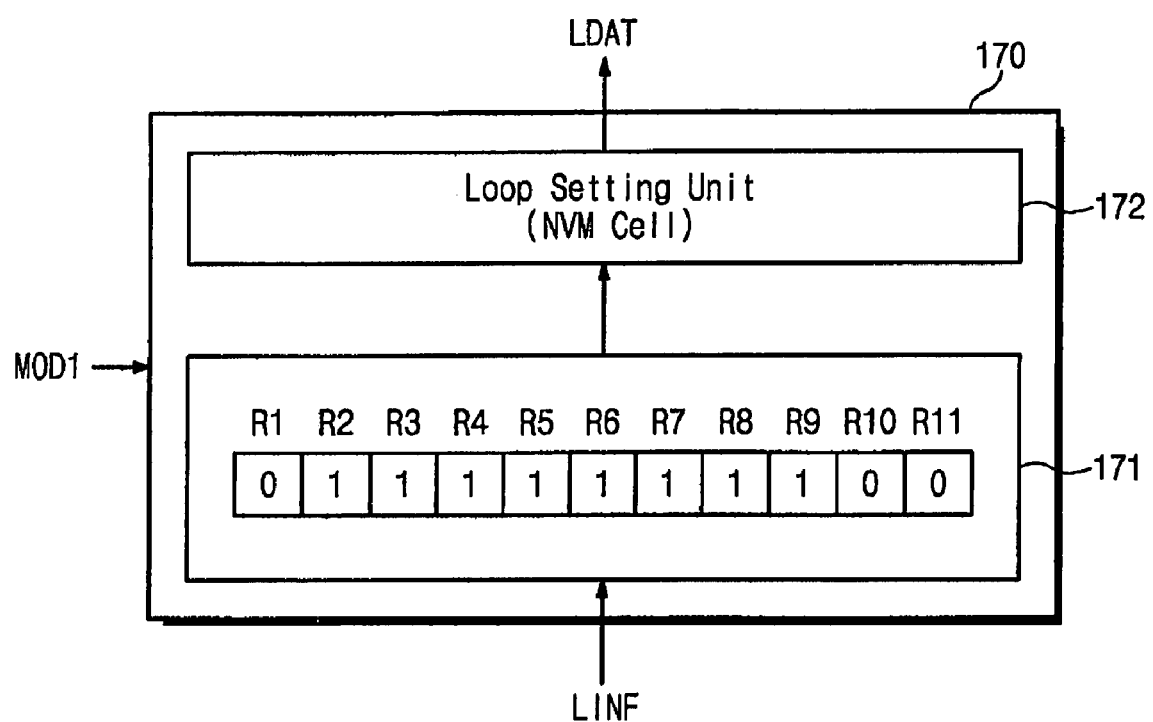
FIGS. 5 and 6 are exemplary block diagrams of possible loop storing circuits adapted to incorporation within the PRAM of FIG. 4.
Figure 6:
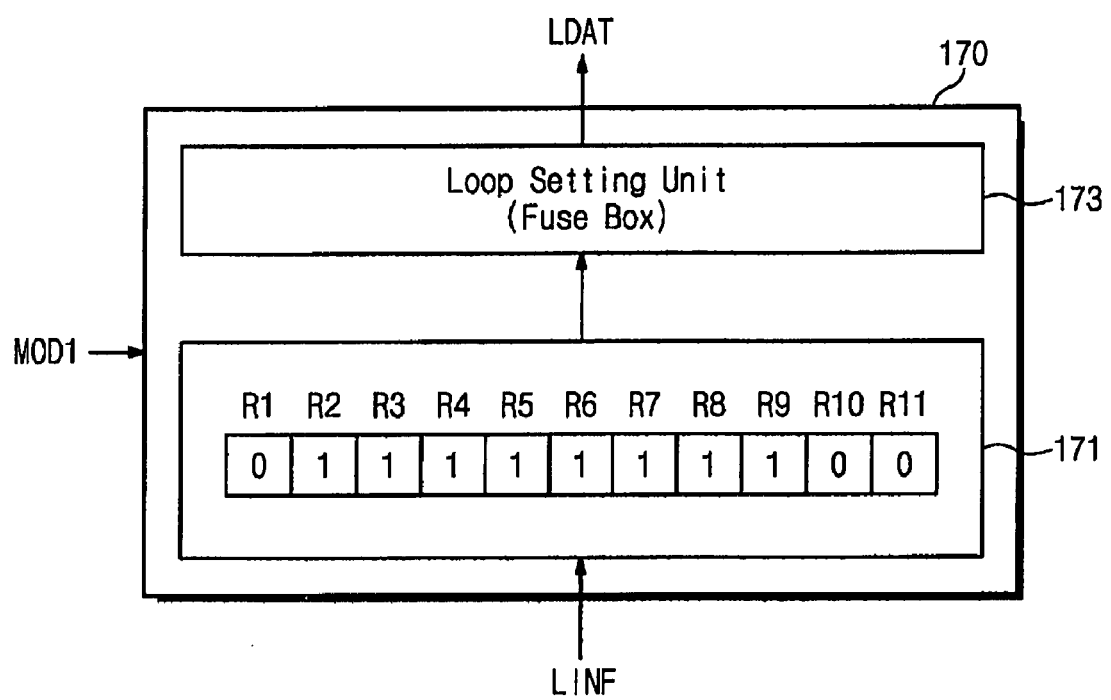

FIGS. 5 and 6 are block diagrams of exemplary loop storing circuits adapted for use in the device of FIG. 4. Referring to FIGS. 5 and 6, loop storage circuit 170 includes a loop storage register 171 and loop setting units 172 and 173. The loop setting unit may be implemented using a nonvolatile memory cell 172 or a fuse box 173. Loop storage circuit 170 operates and receives the loop information LINF, and outputs the loop data LDAT in response to the first mode signal MOD1.

Loop storage register 171 temporarily stores the program verification result for each program loop, i.e., the loop information LINF, during a test operation. However, loop storage register 171 may lose the loop information LINF is power is interrupted. In contrast, loop setting units 172 and 173 retain the loop information LINF when power is OFF.

For example, loop storage register 171 may include eleven registers R1 to R11 as illustrated in FIGS. 5 and 6. The loop information LINF for each program loop is stored in each of registers R1 to R11. The loop information LINF for a first program loop Loop1 is stored in a first register R1, and the information for an eleventh program loop Loop11 is stored in an eleventh register R11.

Referring to FIGS. 5 and 6, data 1 is stored in the second through ninth registers R2 to R9, and data 0 is stored in the rest of the registers R1, R10, and R11. This means that a program pass occurs at least once during second to ninth program loops according to the program verification result for each program loop. PRAM 100 starts a program operation in a second program loop Loop2 during a normal operation, and terminates in a ninth program loop Loop9.

The loop setting unit may include a nonvolatile memory cell 172 of FIG. 5 or the fuse box 173 of FIG. 6. The loop information LINF stored in loop storage register 171 is again stored in nonvolatile memory cell 172 or fuse box 173. Here, the nonvolatile memory cell may be implemented using a phase change memory cell. The phase change memory cell includes a memory element implemented with a phase change material, and a select element for selecting the phase change memory cell. Loop setting units 172 and 173 provide the loop data LDAT to a program loop controller 180.

Referring to FIG. 6, the loop information LINF stored in loop storage register 171 is read via pad 101 of FIG. 4 to store the loop data LDAT in fuse box 173. PRAM 100 includes switch 200 of FIG. 4 for this purpose. Switch 200 transmits the loop information LINF to pad 101 in response to the first and second mode signals MOD1 and MOD2. Thus, the loop information LINF may be read from pad 101 and loop data LDAT may be stored in loop setting unit 173 by cutting a fuse.

Figure 7:
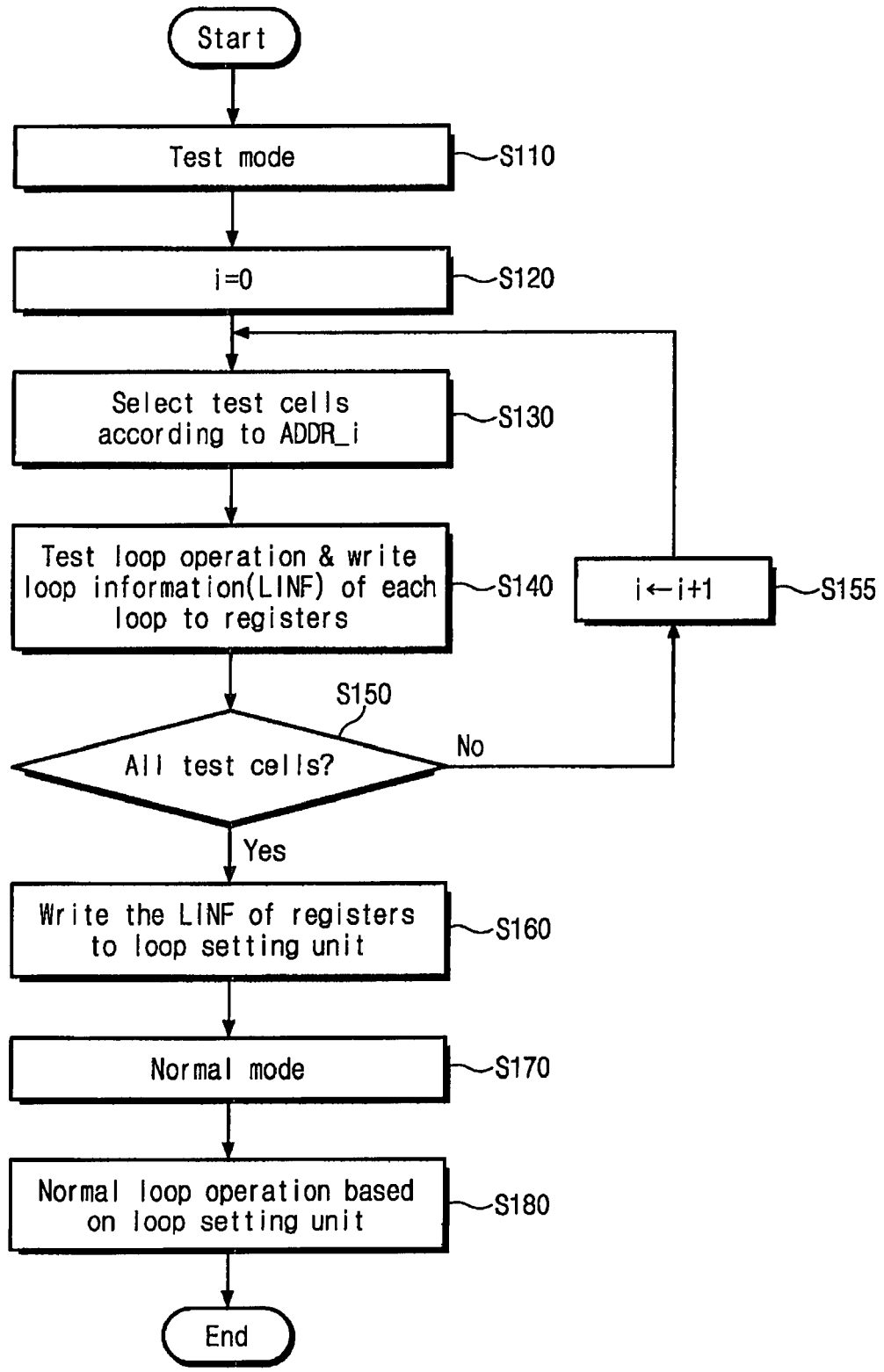
FIG. 7 is a flowchart summarizing operations for the PRAM of FIG. 4.

FIG. 7 is a flowchart illustrating an exemplary operation of PRAM 100 of FIG. 4.

A test mode starts (S110). Mode register set 190 generates a first mode signal MOD1 during the test operation. The first mode signal MOD1 is provided to program loop circuit 160 and loop storage circuit 170.

Next, an address ADDR0 is initialized and input to select a test cell 111 (S120 and S130). For example, a 16 bit test cell may be selected by the address ADDR0.

Then, a test loop operation is performed on the selected test cell (S140). A program loop operation for the 16 bit test cell is performed first. For example, a program current I_PGM is increased step by step from a first program loop Loop1 to a eleventh program loop Loop11 to perform a program verify operation. The loop information LINF for each program loop is stored in loop storing register 171.

It is now determined whether or not the program loop operation for all the test cells has been performed (S150). When the program loop operation for all the test cells is not performed, an address is incremented (S155), and then the program loop operation for another test cell is performed (repeating S130 through S150). For example, after receiving an address ADDR1, a program loop operation is performed on the next 16 bit test cell. The program loop operation is performed step by step from the first program loop Loop1 to the eleventh program loop Loop11, and then the loop information for each program loop is stored.

Ultimately, when the program loop operations are performed on all the test cells, the loop information LINF stored in loop storage register 171 is stored in loop setting units 172 and 173 (S160).

A normal mode now starts (S170). The normal loop operation is performed based on the loop data LDAT stored in the loop setting units 172 and 173 (S180). For example, the first program loop Loop1 is omitted and a program loop operation is performed on the second program loop Loop2. Then, the program loop operation is terminated in the ninth program loop Loop9.

Figure 8:
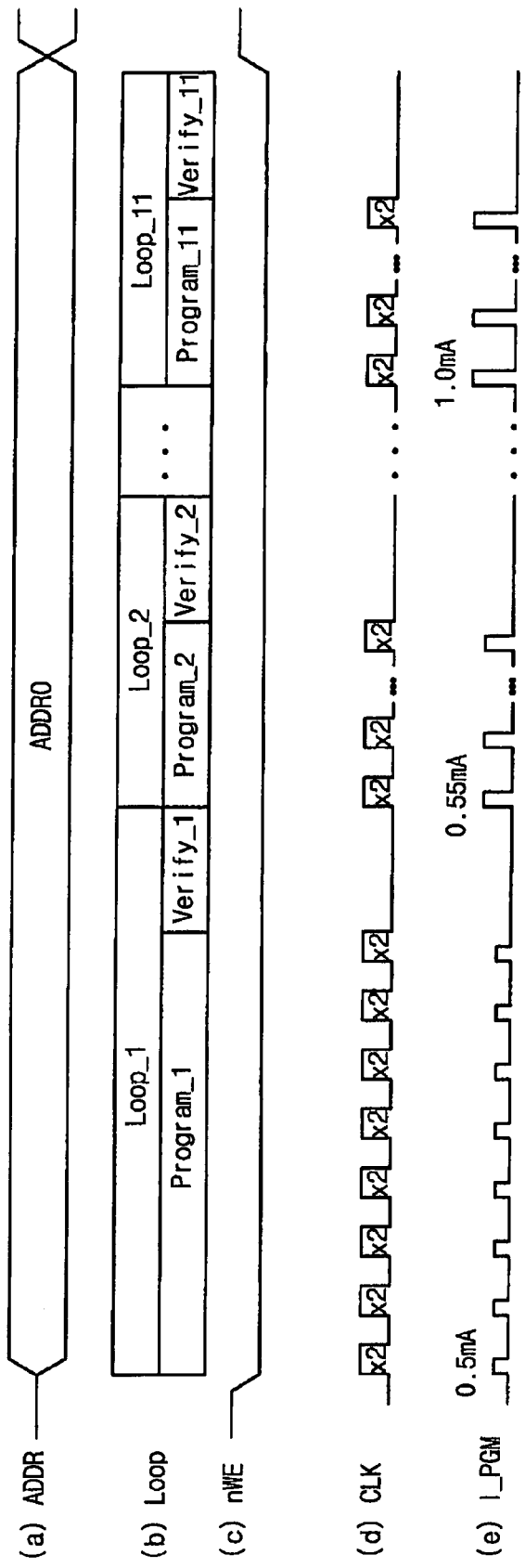
FIG. 8 is an exemplary timing diagram for program loop operations during a test operation.
Figure 9:
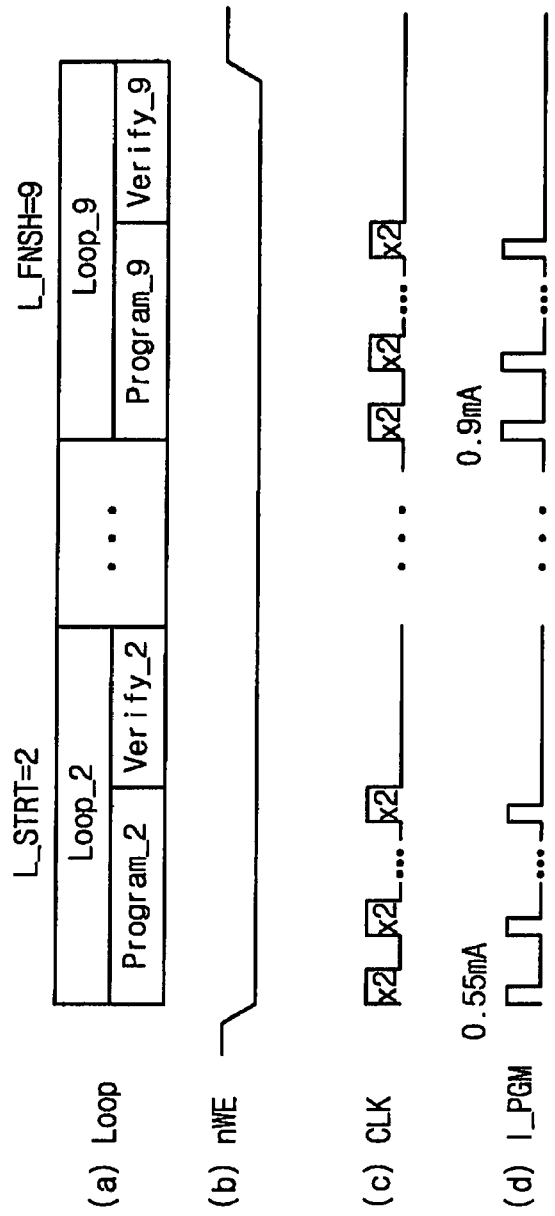
FIG. 9 is an exemplary timing diagram for program loop operations during a normal operation.

FIG. 8 is an exemplary timing diagram for a program loop operation during the test operation. FIG. 9 is an exemplary timing diagram for a program loop operation during the normal operation. Referring to FIGS. 8 and 9, it is assumed that PRAM 100 of FIG. 4 has eleven program loops, and a program current I_PGM increases at increments of 0.05 mA from 0.5 mA. Referring to FIGS. 8 and 9, nWE represents an external write enable signal, and CLK is an internal write enable signal generated by the external write enable signal. Data is programmed by the x2 input/output method in response to the internal write enable signal CLK.

Referring to FIG. 8, PRAM 100 performs a program loop operation on the first 16 bit data first. Here, the first 16 bit data will be stored in test cells 111, and selects a data storage position by using address ADDR0. The program current I_PGM of 0.5 mA is provided into a test cell during a first program loop Loop1, and the program current I_PGM of 0.55 mA is provided during a second program loop Loop2. According to the program verification result of the second program loop Loop2, loop information 1 is stored in the second register of loop storage circuit 170 in a case of a program pass.

Next, a program loop operation is performed on the next 16 bit data. Then, a test cell is selected to store the 16 bit data by using an address ADDR1 (not shown). If the program verification result of the fourth program loop Loop4 is a program pass, loop information 1 is stored in the fourth register R4. Theses operations repeat with respect to all test cells, and then loop information is stored in loop storage register 171. Hereinafter, let's assume that loop information 1 is stored in the second to ninth registers R2 to R9 as results of the test mode operations.

Referring to FIG. 9, PRAM 100 performs a program loop operation based on the loop data LDAT stored in loop setting units 172 and 173 during normal operation. PRAM 100 performs a program loop operation from the second program loop Loop2 in response to the loop start signal L_STRT according to the test operation result in FIG. 8. PRAM 100 terminates the program loop operation in the ninth program loop Loop9 in response to the loop finish signal L_FNSH. A program current of 0.55 mA is applied to the memory cell during the second program loop Loop2, and a program current of 0.9 mA is applied to the memory cell during the ninth program loop Loop9.

According to the foregoing embodiment of the invention, unnecessary program loop(s) may be omitted such that a program time and the consumption of a program current are reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A phase change random access memory (PRAM) performing a program loop operation, the PRAM comprising:
    a memory cell array including a test cell;
    a write driver applying a program pulse and providing a program current to the memory cell array;
    a sense amplification and verification circuit reading data programmed in the memory cell array and performing a program verify operation on the data; and
    a program loop control unit storing program verification result for the test cell at each program loop during test operation and generating the program pulse according to the program verification result to control the start of the program loop during normal operation.

2. The PRAM of claim 1, wherein the program loop control unit comprises:
    a program loop circuit providing the program pulse to the write driver according to the program verification result of the sense amplification and verification circuit;
    a loop storage circuit storing the program verification result for each of the program loops during the test operation; and
    a program loop controller controlling the start of the program loop according to the program verification result stored in the loop storage circuit during normal operation.

3. The PRAM of claim 2, wherein the program loop controller controls the finish of the program loop according to the program verification result stored in the loop storage circuit.

4. The PRAM of claim 2, further comprising a switch outputting the program verification result to a pad, wherein the program verification result is stored in the loop storage circuit.

5. The PRAM of claim 2, wherein the loop storage circuit comprises:
    a loop storage register temporarily storing the program verification result for each of the program loops; and
    a loop setting unit storing the program verification result stored in the register.

6. The PRAM of claim 5, wherein the loop setting unit includes a nonvolatile memory cell storing the program verification result.

7. The PRAM of claim 6, wherein the nonvolatile memory cell comprises; a memory element implemented with a phase change material; and, a select element selecting the nonvolatile memory cell.

8. The PRAM of claim 5, wherein the loop setting unit comprises a fuse box storing the program verification result.

9. The PRAM of claim 8, further comprises a switch outputting the program verification result to a pad, wherein the program verification result is stored in the loop storage circuit, and a fuse in the fuse box is cut in relation to the program verification result read via the pad.

10. The PRAM of claim 2, wherein the loop storage circuit stores the program verification result for each of the program loops derived during chip level testing following manufacture.

11. The PRAM of claim 1, wherein the test operation or normal operation is controlled by data stored in a mode register set (MRS).

12. The PRAM of claim 1, wherein the write driver increases the program current incrementally in relation to successive program loops.

13. The PRAM of claim 1, wherein the memory cell array comprises a plurality of memory cells, each of the memory cells including a memory element implemented with a phase change material and a select element selecting the memory element, wherein the select element is a diode or a transistor.

14. A method of programming a phase change random access memory (PRAM), wherein memory cells within the PRAM are programmed by a program loop operation including a plurality of program loops, and the PRAM includes a memory cell array, a write driver providing a program current to the memory cell array according to a program loop, and a sense amplification and verification circuit reading data programmed in the memory cell array and performing a program verify operation in each program loop, the method comprising:
    performing a test operation to store program verification results for each program loop; and
    performing a normal operation that controls the start of the program loop according to the program verification result.

15. The method of claim 14, wherein the performing of the normal operation controls the finish of the program loop according to the program verification result.

16. The method of claim 14, wherein the program verification results are temporarily stored in a register and then stored in a nonvolatile memory cell.

17. The method of claim 14, wherein the program verification results are temporarily stored in a register and then stored in a fuse box.

18. The method of claim 14, wherein the storing of the program verification result is performed during chip level testing following manufacture of the PRAM.

19. The method of claim 14, wherein the test operation or the normal operation are indicated by data stored in a mode register set (MRS).

20. The method of claim 14, wherein the write driver increases the program current incrementally according to the program loop.

* * * * *